(12) United States Patent
Qin

(10) Patent No.: US 12,189,409 B2
(45) Date of Patent: Jan. 7, 2025

(54) POWER SUPPLY CIRCUIT WITH POWER VOLTAGE NETWORKS TO SELECTIVELY PULL UP POWER VOLTAGE AND MEMORY INCLUDING THE SAME

(71) Applicant: CHANGXIN MEMORY TECHNOLOGIES, INC., Hefei (CN)

(72) Inventor: Jianyong Qin, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 193 days.

(21) Appl. No.: 18/168,647

(22) Filed: Feb. 14, 2023

(65) Prior Publication Data

US 2024/0045457 A1 Feb. 8, 2024

Related U.S. Application Data

(63) Continuation of application No. PCT/CN2022/116644, filed on Sep. 1, 2022.

(30) Foreign Application Priority Data

Aug. 4, 2022 (CN) .......................... 202210935721.6

(51) Int. Cl.
*G05F 1/575* (2006.01)
*G11C 11/4074* (2006.01)
(Continued)

(52) U.S. Cl.
CPC .......... *G05F 1/575* (2013.01); *G11C 11/4074* (2013.01); *G11C 11/4076* (2013.01);
(Continued)

(58) Field of Classification Search
None
See application file for complete search history.

(56) References Cited

U.S. PATENT DOCUMENTS 4,349,777 A * 9/1982 Mitamura ............... H03M 1/00
323/280
7,750,718 B2 7/2010 Kim
(Continued)

OTHER PUBLICATIONS

European Patent Office, Extended European Search Report Issued in Application No. 22940945.3, Jul. 4, 2024, Germany, 16 pages.
(Continued)

*Primary Examiner* — J. H. Hur
(74) *Attorney, Agent, or Firm* — Kilpatrick Townsend & Stockton LLP

(57) ABSTRACT

A power supply circuit and a memory are provided. The power supply circuit includes: a voltage generation module, configured to provide an initial voltage signal; a first power supply module, configured to provide a power reference voltage based on the initial voltage signal; an amplification module, configured to generate and output a first power voltage based on the power reference voltage; a first power network, configured to supply power to at least one function module connected to the first power network; a second power supply module, a second power network and a voltage control module. The second power supply module is configured to provide a second power voltage for the second power network based on the initial voltage signal.

16 Claims, 6 Drawing Sheets

(51) Int. Cl.
*G11C 11/4076* (2006.01)
*G11C 11/4094* (2006.01)
*H03F 3/45* (2006.01)
*H03K 19/20* (2006.01)

(52) U.S. Cl.
CPC ...... *G11C 11/4094* (2013.01); *H03F 3/45264* (2013.01); *H03K 19/20* (2013.01)

(56) References Cited

U.S. PATENT DOCUMENTS

| | | |
|---|---|---|
| 2002/0031032 A1 | 3/2002 | Ooishi |
| 2005/0184775 A1 | 8/2005 | Pilo et al. |
| 2008/0136396 A1* | 6/2008 | Heilmann ................ G05F 1/56 323/298 |
| 2011/0216610 A1 | 9/2011 | Maeda |
| 2013/0193939 A1* | 8/2013 | Sakaguchi .............. G05F 1/573 323/277 |
| 2022/0108736 A1 | 4/2022 | Madhavan et al. |

OTHER PUBLICATIONS

Paul R. Gray: "The Voltage Regulator as a Feedback Circuit" In: "Analysis and Design of Analog Integrated Circuit", Dec. 31, 2009, John Wiley & Sons, Inc., United States of America.
G.C.M. Meijer: "An integrated bandgap reference", IEEE Journal of Solid-State Circuits, vol. 11, No. 3, Jun. 1, 1976, pp. 403-406.
Behzad Razavi: "The Design of a Low-Voltage Bandgap Reference [The Analog Mind]", IEEE Solid-State Circuits Magazine, vol. 13, No. 3, Jan. 1, 2021.

* cited by examiner

POWER SUPPLY CIRCUIT WITH POWER VOLTAGE NETWORKS TO SELECTIVELY PULL UP POWER VOLTAGE AND MEMORY INCLUDING THE SAME

CROSS-REFERENCE TO RELATED APPLICATIONS

This application is a continuation of International Application No. PCT/CN2022/116644, filed on Sep. 1, 2022, which is based upon and claims priority to Chinese Patent Application No. 202210935721.6, filed on Aug. 4, 2022. The contents of International Application No. PCT/CN2022/116644 and Chinese Patent Application No. 202210935721.6 are incorporated herein by their entireties.

BACKGROUND

A Dynamic Random Access Memory (DRAM) is widely applied to modern electronic systems due to the characteristics of high storage density, fast transmission speed, etc. With the development of semiconductor technology, DRAM technology is more and more advanced, and the integration degree of storage cells is higher and higher. Meanwhile, various different applications have higher and high requirements on the performance, power consumption, reliability, etc. of the DRAM.

Due to the higher and higher integration degree of the storage cells, more components and devices need to be connected in the control circuits corresponding to the storage cells to realize the control of the storage cells one by one. When the control circuits are turned on, the memory needs to drive a larger capacitive load, which reduces the turn-on speed of the control circuits, thereby affecting the speed of reading and writing data in the storage cells.

Therefore, when the capacitive loads in the control circuits increase, how to ensure the turn-on speeds of the control circuits is a key factor to improve the reading and writing speed of the memory.

SUMMARY

The disclosure relates to the field of semiconductor circuit design, and in particular, to a power supply circuit and a memory.

A first aspect of the disclosure provides a power supply circuit, which includes: a voltage generation module, configured to provide an initial voltage signal; a first power supply module, connected to the voltage generation module, and configured to provide a power reference voltage based on the initial voltage signal; an amplification module, connected to the first power supply module, and configured to generate and output a first power voltage based on the power reference voltage; a first power network, connected to an output terminal of the amplification module, and configured to supply power to at least one function module connected to the first power network; a second power supply module, connected to the voltage generation module, and configured to provide a second power voltage for a second power network based on the initial voltage signal, a voltage value of the second power voltage is greater than a voltage value of the first power voltage; the second power network, of which a structure is the same as a structure of the first power network, and corresponding nodes in the first power network and the second power network are connected through a voltage control module; and the voltage control module which is turned on based on a voltage control signal, to pull up the first power voltage through the second power voltage, the voltage control signal is generated based on an enable signal of the function module.

A second aspect of the disclosure provides a memory, which includes the power supply circuit provided by the abovementioned embodiment and is configured to be powered by using the power supply circuit.

BRIEF DESCRIPTION OF THE DRAWINGS

One or more embodiments are exemplarily described by the pictures in the corresponding accompanying drawings, and these exemplary descriptions do not constitute a limitation to the embodiments. Unless otherwise stated, the figures in the accompanying drawings do not constitute a proportional limitation. In order to more clearly illustrate the embodiments of the disclosure or the technical solutions in the related art, the drawings used in the description of the embodiments will be briefly described below. It is apparent that the accompanying drawings in the following description are only some embodiments of the disclosure, and other drawings can be obtained by those skilled in the art based on these drawings without any creative work.

DETAILED DESCRIPTION

It can be known from the background that, as the integration degree of storage arrays is getting higher and higher, more components and devices need to be connected in the control circuits corresponding to the storage arrays to realize the control of the storage arrays one by one. It results in that the memory needs to drive a larger capacitive load when the control circuits are turned on, which reduces the turn-on speed of the control circuits, and thereby affecting the reading and writing speed of the storage cells in the storage arrays.

An embodiment of the disclosure provides a power supply circuit, which improves the driving capabilities of the corresponding function modules of the memory by providing a higher power voltage during a turning on stage of the control circuit, thereby improving the reading and writing speed of the memory.

Those of ordinary skill in the art can understand that in various embodiments of the disclosure, many technical details are proposed in order to enable readers to better understand the disclosure. However, the technical solutions claimed in the disclosure can be realized even without these technical details and various changes and modifications based on the following embodiments. The following embodiments are divided for convenience of description and should not constitute any limitation to the specific implementation mode of the disclosure. The embodiments can be combined and referenced to each other without contradiction.

Figure 1:
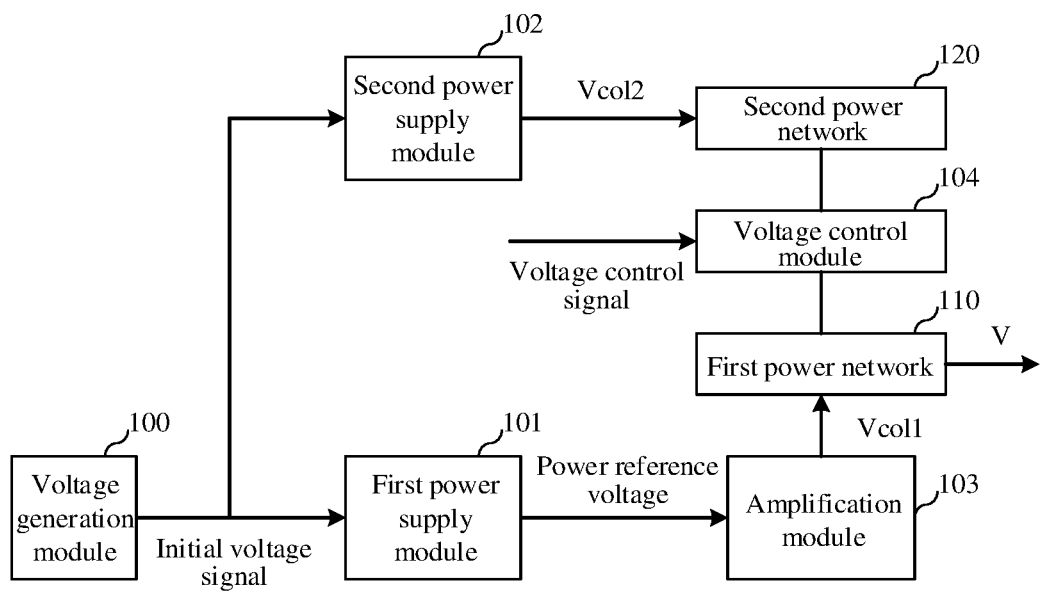
FIG. 1 illustrates a schematic structural diagram of a power supply circuit provided by an embodiment of the disclosure.
Figure 2:
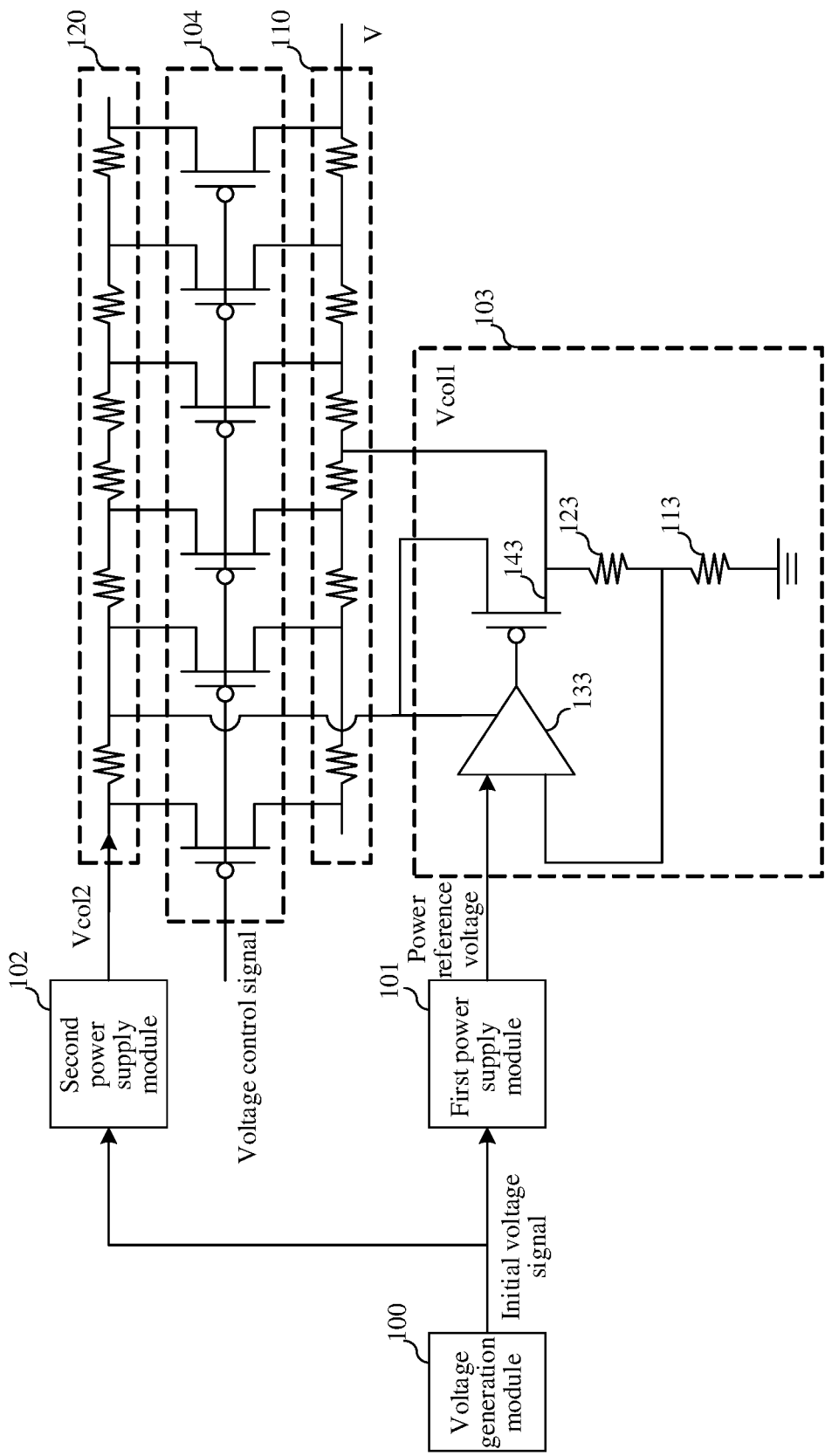
FIG. 2 illustrates a specific schematic structural diagram of a first power network, a voltage control module, a second power network, and an amplification module provided by an embodiment of the disclosure.
Figure 3:
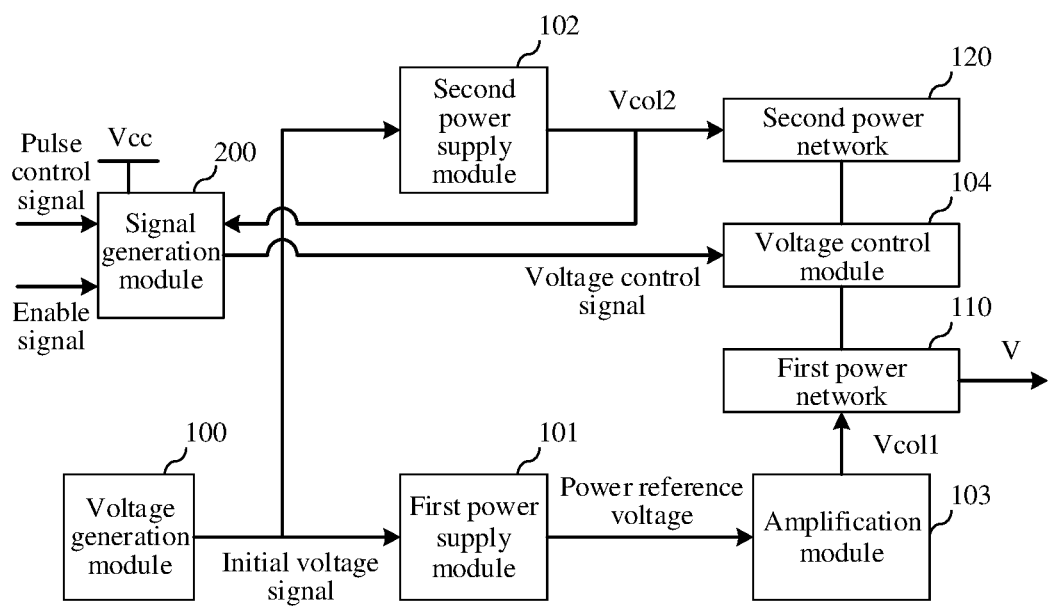
FIG. 3 illustrates a schematic structural diagram of a power supply circuit having a signal generation module provided by an embodiment of the disclosure.
Figure 4:
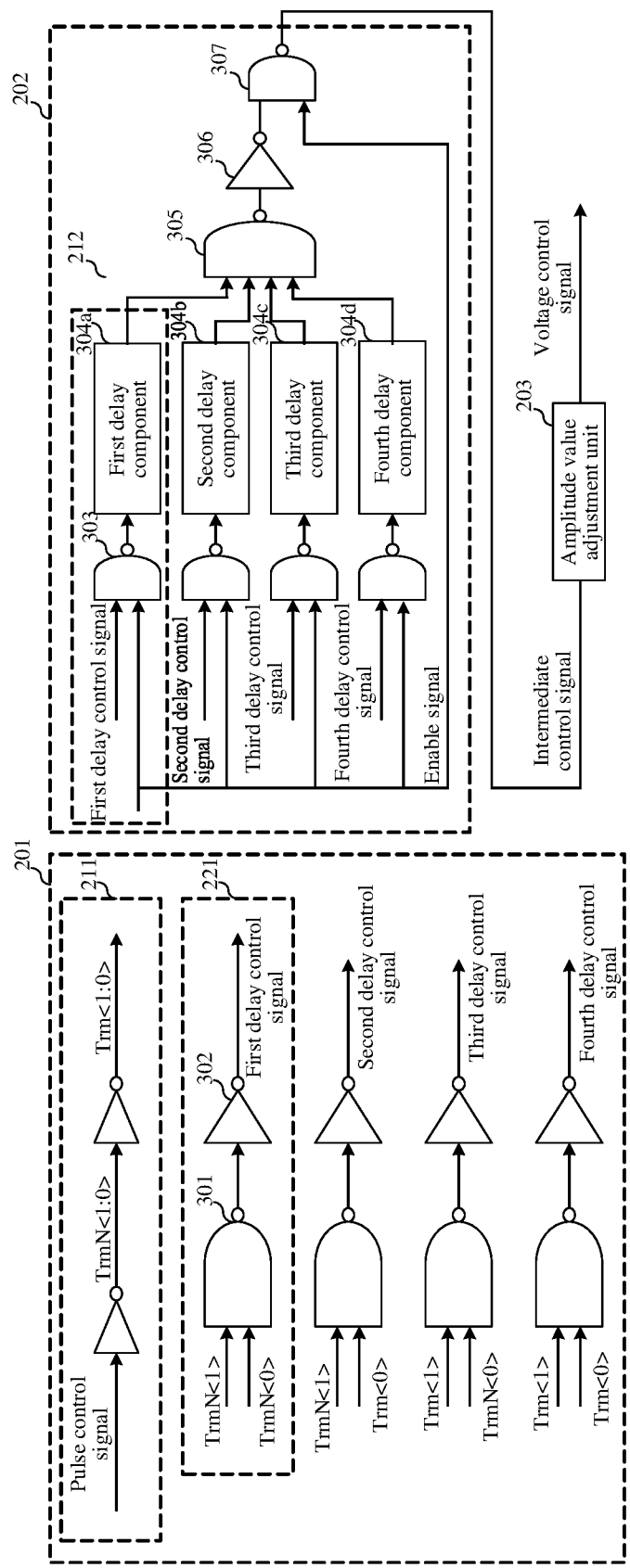
FIG. 4 illustrates a specific schematic structural diagram of a signal generation module provided by an embodiment of the disclosure.
Figure 5:
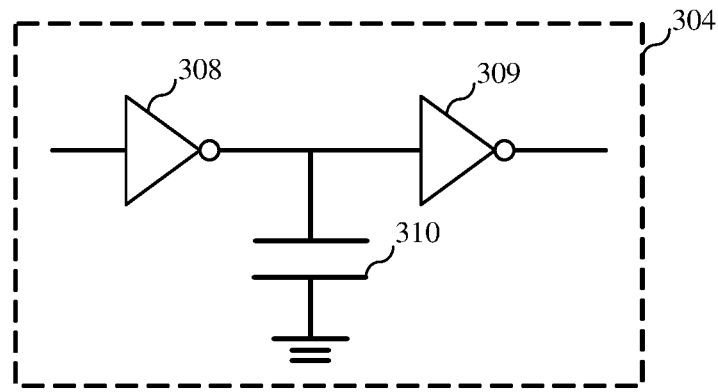
FIG. 5 illustrates a specific schematic structural diagram of a delay component provided by an embodiment of the disclosure.
Figure 6:
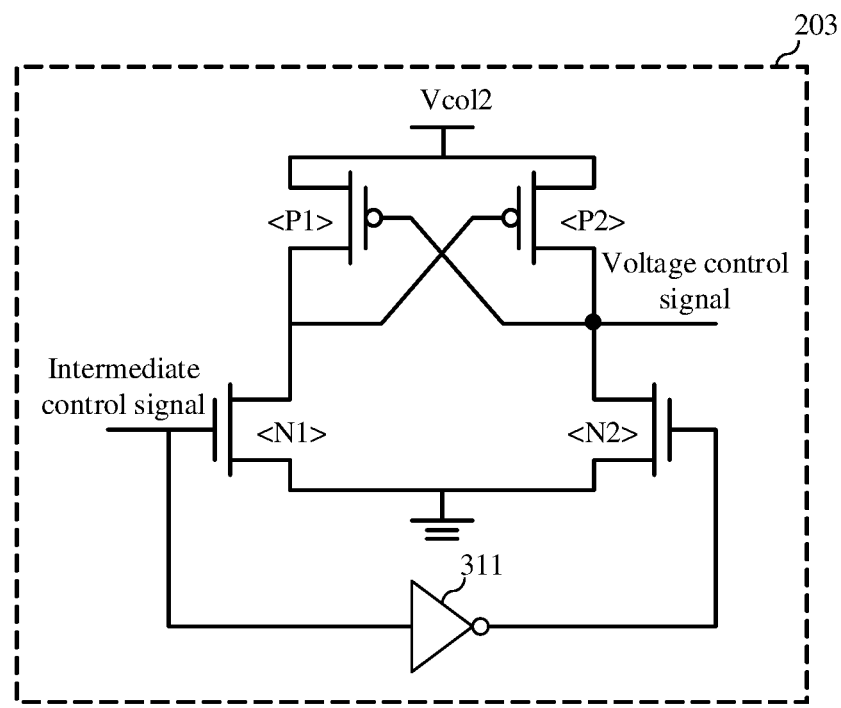
FIG. 6 illustrates a specific schematic structural diagram of an amplitude value adjustment unit provided by an embodiment of the disclosure.
Figure 7:
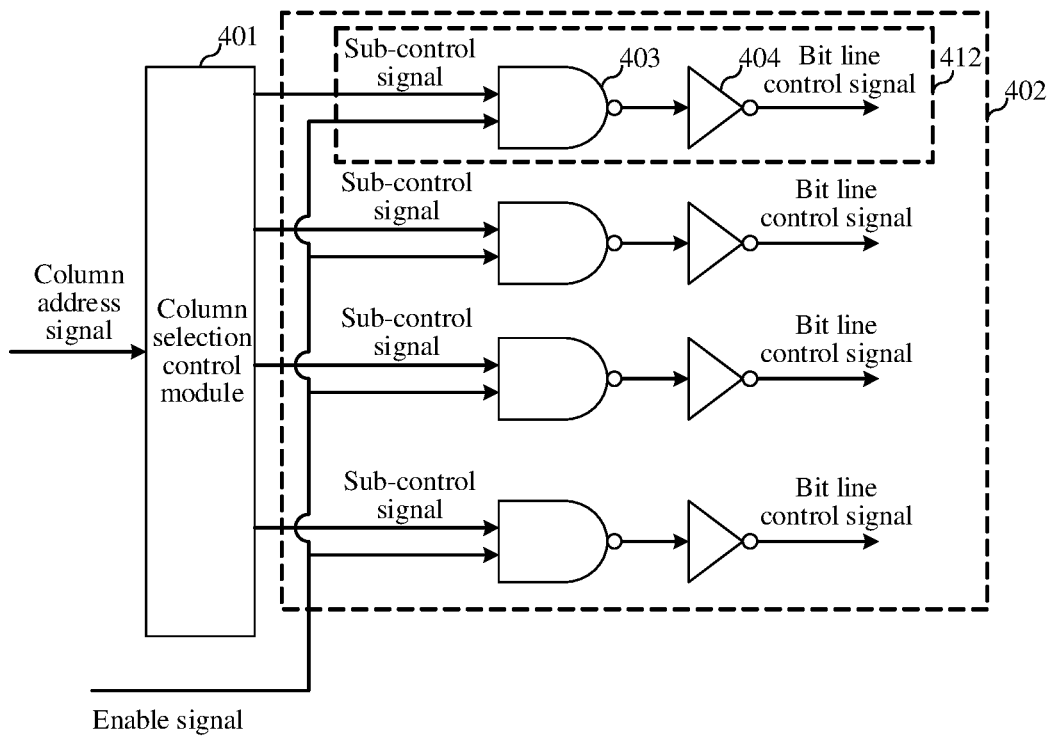
FIG. 7 illustrates a specific schematic structural diagram of a function module provided by an embodiment of the disclosure.
Figure 8:
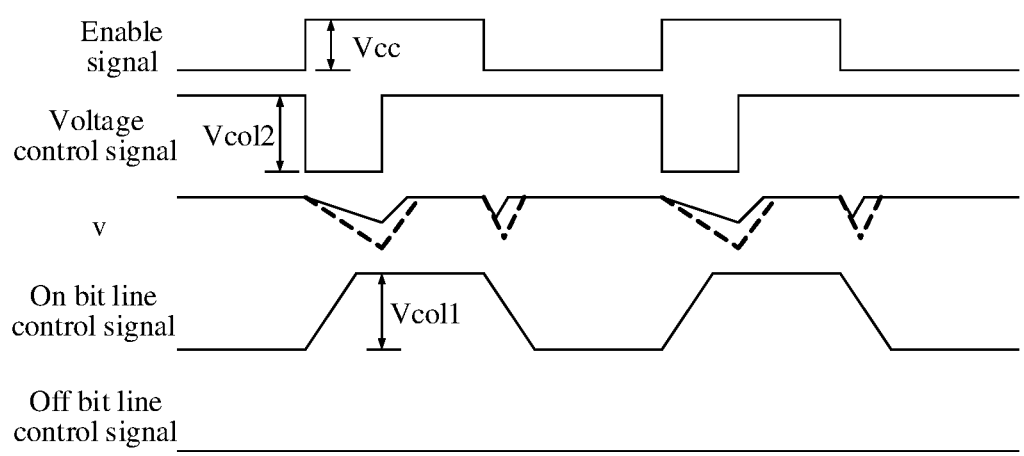
FIG. 8 illustrates a schematic diagram of signal timing for driving the function module of FIG. 7 provided by an embodiment of the disclosure.

FIG. 1 illustrates a schematic structural diagram of a power supply circuit provided by an embodiment of the disclosure. FIG. 2 illustrates a specific schematic structural diagram of a first power network, a voltage control module, a second power network, and an amplification module provided by an embodiment of the disclosure. FIG. 3 illustrates a schematic structural diagram of a power supply circuit having a signal generation module provided by an embodiment of the disclosure. FIG. 4 illustrates a specific schematic structural diagram of a signal generation module provided by an embodiment of the disclosure. FIG. 5 illustrates a specific schematic structural diagram of a delay component provided by an embodiment of the disclosure. FIG. 6 illustrates a specific schematic structural diagram of an amplitude value adjustment unit provided by an embodiment of the disclosure. FIG. 7 illustrates a specific schematic structural diagram of a function module provided by an embodiment of the disclosure. FIG. 8 illustrates a schematic diagram of signal timing for driving the function module of FIG. 7 provided by an embodiment of the disclosure. The power supply circuit provided by an embodiment of the disclosure is described in detail below with reference to the drawings, which is specifically as follows.

With reference to FIG. 1, a power supply circuit includes: a voltage generation module 100, a first power supply module 101, an amplification module 103, a first power network 110, a second power supply module 102, a second power network 120, and a voltage control module 104.

The voltage generation module 100 is configured to provide an initial voltage signal.

The first power supply module 101 is connected to the voltage generation module 100 and is configured to provide a power reference voltage based on the initial voltage signal.

The amplification module 103 is connected to the first power supply module 101 and is configured to generate and output a first power voltage Vcol1 based on the power reference voltage.

The first power network 110 is connected to an output terminal of the amplification module 103, and is configured to supply power to at least one function module connected to the first power network 110.

The second power supply module 102 is connected to the voltage generation module 100 and is configured to provide a second power voltage Vcol2 for a second power network 120 based on the initial voltage signal. A voltage value of the second power voltage Vcol2 is greater than that of the first power voltage Vcol1.

The second power network 120, of which a structure is the same as a structure of the first power network 110. Corresponding nodes in the first power network 110 and the second power network 120 are connected through a voltage control module 104.

The voltage control module 104, which is configured to be turned on based on a voltage control signal, to pull up the first power voltage Vcol1 through the second power voltage Vcol2. The voltage control signal is generated based on an enable signal of the function module.

Specifically, when a function module is turned on upon receiving the enable signal, the power provided by the power supply circuit to the function module through the first power network 110 is the first power voltage Vcol1. In addition, the enable signal is also used to generate a voltage control signal. The voltage control module 104 is turned on based on the voltage control signal. After the voltage control module 104 is turned on, the second power network 120 is electrically connected to the first power network 110, so as to pull up the voltage of the first power network 110 through the second power voltage Vcol2, thereby increasing the output voltage V of the first power network 110. By providing a higher power voltage to drive the function module connected to the first power network 110, the signal processing speed of the corresponding function module is improved, and thus the reading and writing speed of the memory is improved.

It is to be noted that for the voltage control module 104 provided by the abovementioned embodiment, the voltage control module 104 is configured to be turned on based on the voltage control signal, and the voltage control signal is configured to be generated based on the enable signal. In some embodiments, the voltage control module 104 may be configured to be directly turned on based on the enable signal.

In some embodiments, the voltage generation module 100 is configured to provide an initial voltage signal based on a band-gap reference voltage. In a memory, the band-gap reference voltage is a stable voltage signal, and the voltage value is not affected by temperature. Therefore, the initial voltage signal provided by the band-gap reference voltage is not affected by the temperature, thereby generating a stable power reference voltage and a second power voltage Vcol2.

For the amplification module 103, in some embodiments, with reference to FIG. 2, the amplification module 103 includes: an operational amplifier 133, a first feedback resistor 113, a second feedback resistor 123, and a feedback transistor 143. An inverting input terminal of the operational amplifier is configured to receive the power reference voltage. A terminal of the first feedback resistor is grounded, and the other terminal of the first feedback resistor is connected to a terminal of the second feedback resistor 123 and is connected to a non-inverting input terminal of the operational amplifier 133. The other terminal of the second feedback resistor 123 is connected to one of a source or a drain of the feedback transistor 143, and provides the first power voltage Vcol1 for the first power network 110. The other of the source or drain of the feedback transistor 143 is configured to receive the second power voltage Vcol2, and a gate of the feedback transistor is connected to an input terminal of the operational amplifier 133. The working power of the operational amplifier 133 is provided by the second power voltage Vcol2.

For the first power network 110 and the second power network 120, in some embodiments, with reference to FIG. 2, the first power network 110 and the second power network 120 both include multiple nodes. Each of the multiple nodes of the second power network 120 is corresponding to a respective one of the multiple nodes of the first power network 110. Multiple nodes are arranged in the first power network 110 to supply power to multiple function modules located at different positions. Correspondingly, the voltage control module 104 includes: multiple control transistors. Each of the multiple control transistors is corresponding to a respective node in the first power network 110 and a respective node in the second power network 120. Specifically, a gate of the control transistor is configured to receive the voltage control signal, one of a source or drain of the control transistor is connected to respective node in the first power network 110, and the other of the source or drain of the control transistor is connected to respective node in the second power network 120.

With reference to FIG. 3, in the present embodiment, the power supply circuit further includes a signal generation module 200. The signal generation module 200 is configured to generate the voltage control signal based on an enable signal and a pulse control signal. The pulse control signal is used to adjust the signal width of a valid pulse in the voltage control signal generated. The signal generation module 200 controls the width of the valid pulse in the voltage control signal, to control the duration of the conduction of the voltage control module 104, thereby controlling the duration for providing a higher power voltage for the function module by the power supply circuit.

With reference to FIG. 4, the signal generation module 200 includes: a delay control unit 201, a delay unit 202, and an amplitude value adjustment unit 203. The delay control unit 201 is configured to decode the pulse control signal and generate respective delay control signals.

The delay unit 202 is connected to the delay control unit 201 and includes multiple delay sub-units 212. Each of the delay sub-units 212 is configured to be selected to be turned on based on a respective one of the delay control signals, and the delay sub-unit 212 which is turned on is configured to delay the enable signal to generate an intermediate control signal.

The amplitude value adjustment unit 203 is connected to the delay unit 202 and is configured to adjust an amplitude value of the intermediate control signal to generate a voltage control signal.

For the delay control unit 201, in the present embodiment, the delay control unit 201 includes: a first control sub-unit 211, which is configured to generate a first control signal TrmN<1:0>and a second control signal Trm<1:0>with opposite phases according to the pulse control signal. Specifically, with reference to FIG. 4, the first control sub-unit 211 includes a first control inverter and a second control inverter. The first control inverter generates a first control signal TrmN<1:0>based on the pulse control signal, and the second control inverter generates a second control signal Trm<1:0>based on the first control signal TrmN<1:0>.

The delay control unit 201 further includes: multiple second control sub-units 221. Each of the second control sub-units 221 is configured to generate a corresponding delay control signal based on different data bits of the first control signal TrmN<1:0>and the second control signal Trm<1:0>. Only one delay control signal is valid at the same time. In some embodiments, each of the second control sub-units 221 includes a first NAND gate 301 and a first inverter 302.

Specifically, the first control signal TrmN<1:0>and the second control signal Trm<1:0>both contain two data bits. The first one of the second control sub-units 221 generates a first delay control signal based on a first data bit and a second data bit of the first control signal TrmN<1:0>, and the second one of the second control sub-units 221 generates a second delay control signal based on the second data bit of the first control signal TrmN<1:0>and a first data bit of the second control signal Trm<1:0>, the third one of the second control sub-units 221 generates a third delay control signal based on the first data bit of the first control signal TrmN<1:0>and a second data bit of the second control signal Trm<1:0>, and the fourth one of the second control sub-units 221 generates a fourth delay control signal based on the first data bit and the second data bit of the second control signal Trm<1:0>.

Correspondingly, the delay unit 202 includes: multiple third control sub-units 212 each of which corresponding to a respective one of the multiple second control sub-units 221. The third control sub-unit 212 includes: a second NAND gate 303 and a delay component 304a-304d. An input terminal of the second NAND gate is connected to an output terminal of the respective second control sub-unit 221 and is configured to receive a delay control signal output by the corresponding second control sub-unit 221, and the other input terminal of the second NAND gate is configured to receive an enable signal. An input terminal of the delay component is connected to an output terminal of the second NAND gate 303 to delay an output signal of the third control sub-unit. The delay component in each third control sub-unit has different delay duration (that is, the delay durations of the first delay component to the fourth delay component are different). The delay unit 202 further includes: a third NAND gate 305, a third inverter 306, and a fourth NAND gate 307. The third NAND gate includes multiple input terminals, each of the input terminals of the third NAND gate is connected to an output terminal of the delay component 304 in a respective one of different third control sub-units 212. An input terminal of the third inverter is connected to an output terminal of the third NAND gate 305. An input terminal of the fourth NAND gate is connected to an output terminal of the third inverter 306, the other input terminal of the fourth NAND gate is configured to receive the enable signal, and an output terminal of the fourth NAND gate is configured to output the intermediate control signal.

For the delay components 304a to 304d, with reference to FIG. 5, each of the delay components 304a to 304d includes: a fourth inverter 308, a fifth inverter 309, and a delay capacitor 310. An input terminal of the fourth inverter is connected to the output terminal of the second NAND gate 303. An input terminal of the fifth inverter is connected to an output terminal of the fourth inverter 308, and an output terminal of the fifth inverter is connected to the input terminal of the third NAND gate 305. A terminal of the delay capacitor is connected to the output terminal of the fourth inverter 308, and the other terminal of the delay capacitor is grounded. The delay duration of the delay component 304 is set based on capacitance of the delay capacitor 310. Specifically, the larger the capacitance of the delay capacitor 310, the longer the delay duration of the delay component 304; and the smaller the capacitance of the delay capacitor 310, the shorter the delay duration of the delay component 304.

For the amplitude value adjustment unit 203, with reference to FIG. 6, the amplitude value adjustment unit 203 includes: a first N-type transistor <N1>, a second N-type transistor <N2>, a second inverter 311, a first P-type transistor <P1>and a second P-type transistor <P2>. A source of the first N-type transistor is grounded, a drain of the first N-type transistor is connected to a drain of a first P-type transistor <P1>, and a gate of the first N-type transistor is configured to receive the intermediate control signal. A source of the second N-type transistor is grounded, a drain of the second N-type transistor is connected to a drain of a second P-type transistor <P2>and outputs the voltage control signal. An input terminal of the second inverter is connected to the gate of the first N-type transistor <N1>, and an output terminal of the second inverter is connected to a gate of the second N-type transistor <N2>. A source of the first P-type transistor <P1> and a source of the second P-type transistor <P2> are configured to receive a power voltage. A gate of the first P-type transistor <P1> is connected to the drain of the second N-type transistor <N2>. A gate of the second P-type transistor <P2> is connected to a drain of the first N-type transistor <N1>.

With reference to FIG. 6, in some embodiments, the power voltage is set based on the second power voltage Vcol2, and at this moment, a high-level amplitude value of the generated voltage control signal is Vcol2. In some other embodiments, the power voltage may be set based on the internal power voltage of the memory, and at this moment, the high-level amplitude value of the generated voltage control signal is an internal power voltage Vcc.

It is to be noted that, in the present embodiment, since the amplitude value adjustment unit 203 receives an intermediate control signal for an N-type transistor, and the N-type transistor is driven based on a high level, if the valid level of the intermediate control signal generated by the delay unit 202 is a low level, then the low level needs to be input into the amplitude value adjustment unit 203 after being inverted through the second inverter, and an output terminal of the amplitude adjustment unit is connected to the second inverter to output an adjusted voltage control signal.

It is to be noted that, in some embodiments, a driver may further be arranged on a transmission path of an intermediate control signal and a voltage control signal, so as to prevent the intermediate control signal and the voltage control signal from being identified by mistake due to signal attenuation during transmission.

In some embodiments, the signal generation module 200 is also configured to adjust the starting time of a valid pulse in the generated voltage control signal based on a pulse control signal. The signal generation module 200 controls the starting time of the valid pulse in the voltage control signal, so as to control the starting time of the conduction of the voltage control module 104, thereby controlling the starting time of providing a higher power voltage for the function module by the power supply circuit.

For the "function module" mentioned in the present embodiment, in a specific example, with reference to FIG. 7, the function module includes: a column selection control module 401 and a selection driving module 402. The column selection control module is configured to receive and identify a column address signal to generate multiple sub-control signals. The selection driving module is connected to the column selection control module, and includes multiple driving sub-units 412. Each of the driving sub-units 412 corresponds to a respective one of the multiple sub-control signals. The driving sub-unit 412 is configured to generate a bit line control signal based on the enable signal and the respective sub-control signal.

Continuing to with reference to FIG. 7, in an example, the driving sub-unit 412 includes: an AND logical circuit 403 and a driving inverter 404. An input terminal of the AND logical circuit is connected to the column selection control module 401, and is configured to receive sub-control signal, and the other terminal of the AND logical circuit is configured to receive the enable signal. An input terminal of the driving inverter is connected to an output terminal of the AND logical circuit 403 and is configured to output the bit line control signal. When the sub-control signal and the enable signal are received, the driving sub-unit 412 generates a corresponding bit line control signal.

The column address signal is provided by the memory where the function module is located, and is used to control the column selection control module 401 to select to turn on a bit line connected to a target storage cell in a storage array.

With reference to FIG. 8, since a generation path of the enable signal is not generated based on the power voltage provided by the power supply circuit, that is, the enable signal is generated based on the internal power voltage of the memory, the amplitude value of a high level is Vcc; and when the enable signal is valid, a voltage control signal is generated based on the enable signal. In the present embodiment, the signal generation module 200 generates a voltage control signal based on the enable signal. If the power voltage received by the signal generation module 200 is the internal power voltage, then a high level amplitude value of the generated voltage control signal is Vcc. If the power voltage received by the signal generation module 200 is provided based on the power supply circuit, then a high level amplitude value of the generated voltage control signal is Vcol2, Vcol2>Vcc. Since the function module has large capacitive load, and the capacitive load will block the voltage change in the circuit, when the function module is turned on or turned off based on the enable signal, the capacitive load will pull down the provided power voltage. When the power voltage is provided based on the power supply circuit, that is, the input of the power voltage is increased, the pull back speed of circuit voltage will be increased (the voltage of a circuit of a component or device when powered based on the internal power voltage is shown by a dotted line in FIG. 8, and the voltage of the circuit of the component or device when powered based on the power supply circuit is shown by a solid line in FIG. 8). The power supplied by the power supply circuit enables to reduce the change of a circuit voltage where the component or device is located due to the capacitive load to a certain extent, thereby improving the driving capability of the component or device.

It is to be noted that the high level amplitude value of the voltage control signal as shown in FIG. 8 is specifically described by taking Vcol2 as an example, which does not constitute a limitation to FIG. 8.

For the abovementioned column selection control module 401 and the selection drive module 402, when the integration degree of a memory increases, that is, the memory includes more storage cells, more word lines and bit lines are required to correspondingly control a storage array to select to turn on a target storage cell in the storage array, and the number of word lines and bit lines increases, that is, more selection driving circuits are required, thus increasing the load of the selection driving circuit. The power supply circuit provided by the present embodiment increases the power voltage provided to the function module (corresponding to the abovementioned function module, that is, increases the power voltage provided to each component or device in the column selection control module 401 and the selection driving module 402) to improve the driving capability of the component or device in the column selection control module 401 and the selection driving module 402, thereby improving the turn-on speed of the column selection control module 401 and the selection driving module 402, and then improving the reading and writing speed of the storage cell.

It is be noted that, in another example, the driving sub-unit may also be realized through an AND gate. An input terminal of the AND gate is configured to receive the enable signal, and the other input terminal is configured to receive a sub-control signal.

In some embodiments, the transmission path of an enable module also includes a driver. The driver is configured to prevent an amplitude value of the enable signal from attenuating in a transmission process, so as to avoid the error identification of the driving sub-unit 412. In one example, the driver may be integrated in the corresponding driving sub-unit 412, that is, each driving sub-unit 412 is also provided with a corresponding driver. In another example, the driver may be arranged independently of the driving sub-unit 412, that is, all the driving sub-units 412 are driven by the enable signal transmitted by one driver.

For the power supply circuit provided by the present embodiment, when the function module is turned on upon receiving the enable signal, the power provided by the power supply circuit to the function module through the first power network 110 is the first power voltage Vco1. In addition, the enable signal is also used to generate a voltage control signal. The voltage control module 104 is turned on based on the voltage control signal. After the voltage control module 104 is turned on, the second power network 120 is electrically connected to the first power network 110, so as to pull up the voltage of the first power network 110 through the second power voltage Vco12, thereby increasing the output voltage V of the first power network 110. The signal processing speed of the corresponding function module is improved by providing a higher power voltage for drive the function module connected to the first power network 110, so that the reading and writing speed of the memory is improved.

It is worth mentioning that each unit involved in this embodiment is a logical unit. In practical applications, a logical unit can be a physical unit or a part of a physical unit, and can also be implemented in combination of multiple physical units. In addition, in order to highlight the innovation part of the application, the embodiment does not introduce units that are not closely related to solving the technical problems raised in the application, but this does not mean that there are no other units in the embodiment.

It is to be noted that the features disclosed in the power supply circuit provided by the abovementioned embodiment may be freely combined without conflicts to obtain new power supply circuit embodiments.

Another embodiment of the disclosure provides a memory. The power supply circuit provided by the abovementioned embodiment is used for supplying power, so as to improve the driving capability of a corresponding function module of the memory by supplying a higher power voltage, thereby improving the reading and writing speed of the memory.

Specifically, when the function module is turned on upon receiving the enable signal, the power provided by the power supply circuit to the function module through the first power network is the first power voltage. In addition, the enable signal is also used to generate a voltage control signal. The voltage control module is turned on based on the voltage control signal. After the voltage control module is turned on, the second power network is electrically connected to the first power network, so as to pull up the voltage of the first power network through the second power voltage, thereby increasing the output voltage of the first power network. The signal processing speed of the corresponding function module is improved by providing a higher power voltage for drive the function module connected to the first power network, so that the reading and writing speed of the memory is improved.

It is to be noted that the memory may be a storage cell or apparatus based on a semiconductor apparatus or component. For example, a memory apparatus may be a volatile memory, such as a DRAM, a Synchronous Dynamic Random Access Memory (SDRAM), a Double Data Rate (DDR) SDRAM, a Low Power Double Data Rate (LPDDR) SDRAM, a Graphics Double Data Rate (GDDR) SDRAM, a Double Data Rate 2 (DDR2) SDRAM, a Double Data Rate 3 (DDR3) SDRAM, a Double Data Rate 4 (DDR4) SDRAM, a Thyristor Random Access Memory (TRAM), or an non-volatile memory, such as a Phase Change Random Access Memory (PRAM), a Magnetic Random Access Memory (MRAM), or a Resistive Random Access Memory (RRAM).

In some examples, the terms "module" and "unit" and the like in the semiconductor memory may be implemented by one or more hardware circuits/sub-circuits and/or one or more processors. In some examples, a module or unit may include one or more circuits with or without stored code or instructions. The module or unit may include one or more components that are directly or indirectly connected. These components may or may not be physically attached to, or located adjacent to, one another.

Those skilled in the art can understand that the above-mentioned embodiments are specific embodiments to implement the disclosure. In practical applications, various changes can be made in forms and details without departing from the spirit and scope of the disclosure.

The invention claimed is:

1. A power supply circuit, comprising:
   a voltage generation module, configured to provide an initial voltage signal;
   a first power supply module, connected to the voltage generation module, and configured to provide a power reference voltage based on the initial voltage signal;
   an amplification module, connected to the first power supply module, and configured to generate and output a first power voltage based on the power reference voltage;
   a first power network, connected to an output terminal of the amplification module, and configured to supply power to at least one function module connected to the first power network;
   a second power supply module, connected to the voltage generation module, and configured to provide a second power voltage for a second power network based on the initial voltage signal, wherein a voltage value of the second power voltage is greater than a voltage value of the first power voltage;
   the second power network, of which a structure being the same as a structure of the first power network, and corresponding nodes in the first power network and the second power network being connected through a voltage control module; and
   the voltage control module, configured to be turned on based on a voltage control signal, to pull up the first power voltage through the second power voltage, wherein the voltage control signal is generated based on an enable signal of the function module.

2. The power supply circuit of claim 1, wherein
   the first power network comprises a plurality of nodes, and the second power network comprises a plurality of nodes each corresponding to a respective one of the plurality of nodes in the first power network; and
   wherein the voltage control module comprises a plurality of control transistors each corresponding to a respective node in the first power network and a respective node in the second power network; and
   a gate of the control transistor is configured to receive the voltage control signal, one of a source or drain of the control transistor is connected to the respective node in the first power network, and the other of the source or drain of the control transistor is connected to the respective node in the second power network.

3. The power supply circuit of claim 1, wherein the amplification module comprises:
an operational amplifier, having an inverting input terminal configured to receive the power reference voltage;
a first feedback resistor;
a second feedback resistor; and
a feedback transistor,
wherein a terminal of the first feedback resistor is grounded, and the other terminal of the first feedback resistor is connected to a terminal of the second feedback resistor and is connected to a non-inverting input terminal of the operational amplifier;
the other terminal of the second feedback resistor is connected to one of a source or drain of the feedback transistor, and is configured to provide the first power voltage for the first power network;
the other of the source or drain of the feedback transistor is configured to receive the second power voltage, and a gate of the feedback transistor is connected to an input terminal of the operational amplifier; and
working power of the operational amplifier is provided based on the second power voltage.

4. The power supply circuit of claim 1, further comprising: a signal generation module, configured to generate the voltage control signal based on the enable signal and a pulse control signal, wherein the pulse control signal is used to adjust a signal width of a valid pulse in the voltage control signal generated.

5. The power supply circuit of claim 4, wherein the signal generation module is further configured to adjust, based on the pulse control signal, a starting time of the valid pulse in the voltage control signal generated.

6. The power supply circuit of claim 4, wherein the signal generation module comprises:
a delay control unit, configured to decode the pulse control signal and generate respective delay control signals;
a delay unit, connected to the delay control unit, and comprising a plurality of delay sub-units, each delay sub-unit being configured to be selected to be turned on based on a respective one of the delay control signals, and the delay sub-unit which is turned on being configured to delay the enable signal to generate an intermediate control signal; and
an amplitude value adjustment unit, connected to the delay unit, and configured to adjust an amplitude value of the intermediate control signal to generate the voltage control signal.

7. The power supply circuit of claim 6, wherein the delay control unit comprises:
a first control sub-unit, configured to generate a first control signal and a second control signal with opposite phases based on the pulse control signal; and
a plurality of second control sub-units, each of which being configured to generate a respective one of the delay control signals based on different data bits of the first control signal and the second control signal.

8. The power supply circuit of claim 7, wherein the second control sub-unit comprises a first NAND gate and a first inverter.

9. The power supply circuit of claim 7, wherein the delay unit comprises:
a plurality of third control sub-units, each of which corresponding to a respective one of the plurality of second control sub-units, wherein the third control sub-unit comprises: a second NAND gate and a delay component, an input terminal of the second NAND gate is connected to an output terminal of the respective second control sub-unit, and the other input terminal of the second NAND gate is configured to receive the enable signal; an input terminal of the delay component is connected to an output terminal of the second NAND gate to delay an output signal of the third control sub-unit; and wherein delay components in the third control sub-units have different delay durations;
a third NAND gate, having a plurality of input terminals, each of which being connected to an output terminal of the delay component in a respective one of the third control sub-units;
a third inverter, having an input terminal connected to an output terminal of the third NAND gate; and
a fourth NAND gate, having an input terminal connected to an output terminal of the third inverter, the other input terminal configured to receive the enable signal, and an output terminal configured to output the intermediate control signal.

10. The power supply circuit of claim 9, wherein the delay component comprises:
a fourth inverter, having an input terminal connected to the output terminal of the second NAND gate;
a fifth inverter, having an input terminal connected to an output terminal of the fourth inverter, and an output terminal connected to the input terminal of the third NAND gate; and
a delay capacitor, having a terminal connected to the output terminal of the fourth inverter, and the other terminal which is grounded, wherein
a delay duration of the delay component is set based on capacitance of the delay capacitor.

11. The power supply circuit of claim 6, wherein the amplitude value adjustment unit comprises: a first N-type transistor, a second N-type transistor, a second inverter, a first P-type transistor and a second P-type transistor, wherein
a source of the first N-type transistor is grounded, a drain of the first N-type transistor is connected to a drain of a first P-type transistor, and a gate of the first N-type transistor is configured to receive the intermediate control signal;
a source of the second N-type transistor is grounded, a drain of the second N-type transistor is connected to a drain of a second P-type transistor and is configured to output the voltage control signal;
an input terminal of the second inverter is connected to the gate of the first N-type transistor, and an output terminal of the second inverter is connected to a gate of the second N-type transistor; and
a source of the first P-type transistor and a source of the second P-type transistor are configured to receive a power voltage, a gate of the first P-type transistor is connected to the drain of the second N-type transistor, and a gate of the second P-type transistor is connected to the drain of the first N-type transistor.

12. The power supply circuit of claim 11, wherein the power voltage is set based on the second power voltage.

13. The power supply circuit of claim 1, wherein the voltage generation module is configured to provide the initial voltage signal based on a band-gap reference voltage.

14. The power supply circuit of claim 1, wherein the function module comprises:

a column selection control module, configured to receive and identify a column address signal to generate a plurality of sub-control signals; and a selection driving module, connected to the column selection control module, and comprising a plurality of driving sub-units, wherein each of the plurality of driving sub-units corresponds to a respective one of the plurality of sub-control signals, and the driving sub-unit is configured to generate a bit line control signal based on the enable signal and the respective sub-control signal.

15. The power supply circuit of claim 14, wherein the driving sub-unit comprises:

an AND logical circuit, having an input terminal which is connected to the column selection control module and is configured to receive the sub-control signal, and the other input terminal configured to receive the enable signal; and a driving inverter, having an input terminal which is connected to an output terminal of the AND logical circuit and is configured to output the bit line control signal.

16. A memory, comprising the power supply circuit of claim 1, and being configured to be powered by the power supply circuit.

* * * * *